(12) United States Patent
Shih et al.

(10) Patent No.: US 6,288,604 B1
(45) Date of Patent: Sep. 11, 2001

(54) CMOS AMPLIFIER PROVIDING AUTOMATIC OFFSET CANCELLATION

(75) Inventors: Cheng-chung Shih, Fremont; Jiann-chyi Shieh, San Jose, both of CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/244,273

(22) Filed: Feb. 3, 1999

Related U.S. Application Data

(60) Provisional application No. 60/073,533, filed on Feb. 3, 1998.

(51) Int. Cl.$^7$ .................................................. H03F 1/02
(52) U.S. Cl. .............................. 330/9; 330/85; 330/253; 330/256; 330/260; 327/307
(58) Field of Search ................... 330/9, 253, 256, 330/260, 85; 327/307

(56) References Cited

U.S. PATENT DOCUMENTS

| | | | |
|---|---|---|---|
| 3,609,572 | * | 9/1971 | Vilbis .................................. 330/260 |
| 3,958,185 | * | 5/1976 | Hartung ................................ 330/85 |
| 4,752,744 | * | 6/1988 | Aoki .................................... 330/252 |
| 5,166,635 | * | 11/1992 | Shih .................................... 330/253 |
| 5,218,320 | * | 6/1993 | Albouy et al. ...................... 330/260 |
| 5,446,405 | * | 8/1995 | Ikeda .................................... 330/9 |
| 5,798,660 | * | 8/1998 | Cheng .................................. 327/65 |
| 5,798,664 | * | 8/1998 | Nagahori et al. ................... 327/307 |

* cited by examiner

Primary Examiner—Michael B Shingleton
(74) Attorney, Agent, or Firm—Arent Fox Kintner Plotkin & Kahn PLLC

(57) ABSTRACT

An amplifier circuit is responsive to an input data signal which is substantially DC balanced. The amplifier circuit is operative to generate an amplified data signal, and includes: a limiting amplifier responsive to the input data signal and to an error correcting signal, the limiting amplifier being operative to generate the amplified data signal; a feed back circuit responsive to a signal proportional to the amplified data signal, the feed back circuit being operative to generate the error correcting signal. The feed back circuit includes: a low pass filter responsive to the signal proportional to the amplified data signal, and operative to generate a filtered signal; and an error amplifier responsive to the filtered signal, and operative to provide the error correcting signal to the limiting amplifier; whereby offset voltage caused by process characteristics of the limiting amplifier, and temperature variations in the limiting amplifier are canceled by the error correcting feedback signal. The limiting amplifier further includes: a first amplifying stage operative to provide a first stage amplified signal; a second amplifying stage responsive to the first stage amplified signal, and operative to provide a second stage amplified signal; and a third amplifying stage responsive to the second stage amplified signal, and operative to generate the amplified data signal. The low pass filter of the feedback circuit generates the filtered signal in response to the second stage amplified signal; and the error correcting signal is provided to the second amplifying stage of the limiting amplifier.

8 Claims, 9 Drawing Sheets

CMOS AMPLIFIER PROVIDING AUTOMATIC OFFSET CANCELLATION

CROSS REFERENCE TO RELATED APPLICATIONS

This application claims priority to U.S. patent application Ser. No. 60/073,533, filed Feb. 3, 1998, entitled "CMOS Post-Amplifier With Temperature Independent Automatic Offset Zeroing" which is incorporated herein by reference.

BACKGROUND OF THE INVENTION

1. Field of the Invention

The present invention relates generally to electronic amplifier circuits implemented using complementary metal oxide semiconductor (CMOS) technology. More specifically, the present invention relates to a CMOS amplifier circuit providing improved performance characteristics including automatic cancellation of offset voltage.

2. Description of the Prior Art

In ideal linear amplifier circuits, each differential pair of transistors in each amplifying stage of a chain is perfectly balanced so that there is no offset voltage which can lead to errors in the linear relationship between the input signal level and output signal level of the amplifier circuit. However, due to imperfect processing characteristics combined with the effects of temperature variations, an offset voltage, $V_{OS}$, typically arises between each differential pair of transistors.

It is particularly difficult to achieve balanced characteristics between differential pairs of transistors in amplifier circuits implemented using complementary metal oxide semiconductor (CMOS) technology. While bipolar junction transistor (BJT) technology, which allows for better processing control, may be used to implement amplifier circuits for many types of applications, CMOS technology is commonly preferred because of lower cost.

The linearity of an amplifier circuit is particularly important in data processing applications wherein the signal received at the input of the amplifier circuit is very small. Therefore, in such applications, it is very desirable that each differential pair of transistors be very well balanced, having minimal offset voltage. It is also particularly important in such applications that there be minimal DC wandering.

A fiber optic receiver is one example of an electronic system requiring a linear amplifier circuit for amplifying an input signal which is very small. A fiber-optic receiver typically includes: a photodiode for receiving the fiber-optic signal, and for generating an electrical analog signal; a pre-amplifier responsive to the analog signal, and operative to generate a pre-amplified analog signal; a post-amplifier responsive to the pre-amplified analog signal, and operative to generate a post-amplified analog signal; and a data slicer for converting the post-amplified analog signal to a digital data signal.

The signal level of the pre-amplified analog signal received by the post-amplifier is typically only a few millivolts (mV). Typically, the post-amplifier includes a CMOS input stage having a differential pair which is subject to create an offset voltage in the range of tens of millivolts. This problem causes errors in the linearity of the post-amplifier circuit which lead to data errors as the post-amplified analog signal is processed by the data slicer. The data slicer cannot provide an accurate digital data signal unless the offset voltage of the post-amplifier circuit is properly canceled. Additionally, an input port of the post amplifier may be coupled with an AC coupling capacitor which may also have a DC wandering effect which needs to be compensated in order to generate digital signal levels required for data processing including clock/data recovering.

Typical prior art post-amplifiers include: an automatic gain control amplifier (AGC amplifier) having an input port for receiving an input data signal, and an output port for providing an amplified data signal; and a feedback circuit coupled between the output port and the input port of the AGC amplifier. To reduce the undesirable effects of offset voltage, the feedback circuit in prior art post-amplifiers typically includes: a peak detection circuit connected to receive the amplified data signal from the output port of the AGC amplifier, and being operative to sense peak levels of the differential pair of amplified data signal levels, and being further operative to provide an offset correction signal which is proportional to the voltage offset between the differential pair of amplified data signal levels; and an error amplifier for amplifying the offset signal, and providing an amplified offset signal back to the input port of the AGC amplifier in a negative feedback manner in order to cancel the voltage offset arising in the AGC amplifier.

One problem associated with the use of a peak detection circuit in a negative feedback path for canceling offset voltage arising in a post-amplifier is that peak detection circuits can provide an inaccurate indication of the actual offset voltage in the AGC amplifier due to a variety of problems including the inherent voltage offset of the peak detection circuitry itself. Another problem associated with the use of a peak detection circuits for canceling voltage offset in a post-amplifier is that peak detection circuits are complex and expensive.

What is needed is an accurate and cost effective method and apparatus for canceling voltage offset arising in an amplifier circuit.

SUMMARY OF THE INVENTION

It is an object of the present invention to provide an accurate and cost effective method and apparatus for minimizing voltage offset in an amplifier circuit.

Briefly, a presently preferred embodiment of the present invention includes an amplifier circuit responsive to an input data signal which is substantially DC balanced, the amplifier circuit being operative to generate an amplified data signal. The amplifier circuit includes: a limiting amplifier responsive to the input data signal and to an error correcting signal, the limiting amplifier being operative to generate the amplified data signal; a feed back circuit responsive to a signal proportional to the amplified data signal, the feed back circuit being operative to generate the error correcting signal. The feed back circuit includes: a low pass filter responsive to the signal proportional to the amplified data signal, and operative to generate a filtered signal; and an error amplifier responsive to the filtered signal, and operative to provide the error correcting signal to the limiting amplifier; whereby offset voltage caused by process characteristics of the limiting amplifier, and temperature variations in the limiting amplifier are canceled by the error correcting feedback signal.

The limiting amplifier further includes: a first amplifying stage responsive to the input data signal, and being operative to provide a first pre-amplified signal; a second amplifying stage responsive to the first pre-amplified signal, and being operative to provide a second pre-amplified signal; and a third amplifying stage responsive to the second preamplified signal, and being operative to generate the amplified data signal. In accordance with one aspect of the invention, the low pass filter of the feedback circuit generates the filtered signal in response to the second preamplified signal; and the error correcting feedback signal is provided to the second amplifying stage of the limiting amplifier.

An important advantage of an amplifier circuit according to the present invention is that it provides cost effective circuitry for accurately canceling offset voltage generated in an amplifier circuit which is responsive to a DC balanced signal, that is a signal which has been encoded encoded to achieve substantially balanced DC coding.

The foregoing and other objects, features, and advantages of the present invention will be apparent from the following detailed description of the preferred embodiment which makes reference to the several figures of the drawing.

IN THE DRAWING

Figure 1:
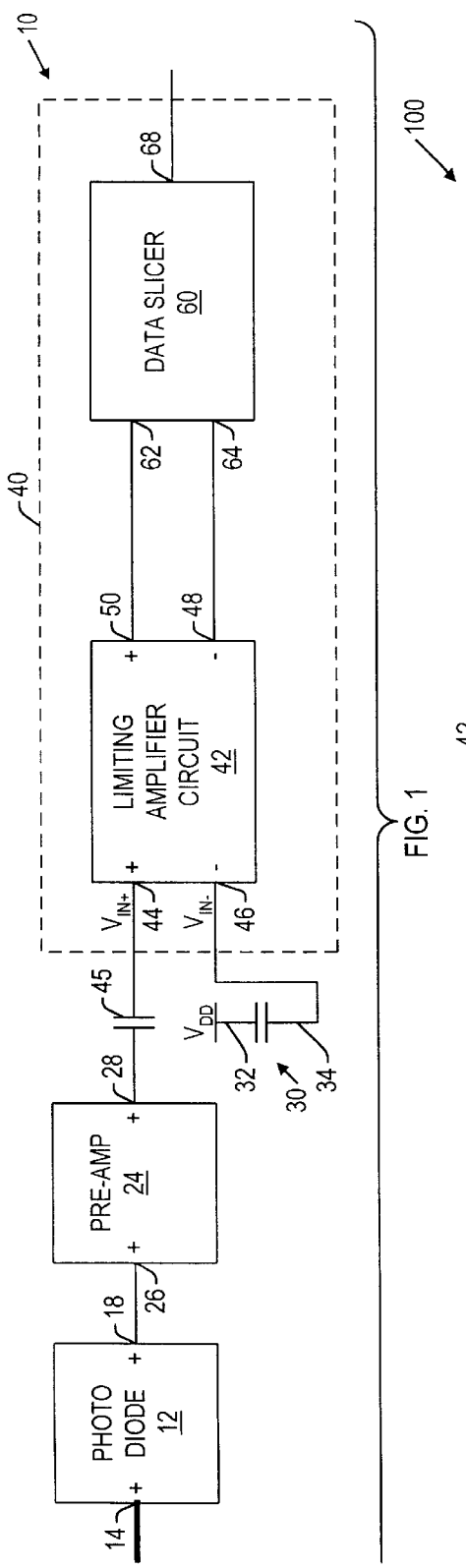
FIG. 1 is a generalized block diagram of a fiber optic signal receiving and conversion sub-system including a preamplifier, a limiting amplifier circuit and a data slicer circuit according to the present invention.
Figure 2:
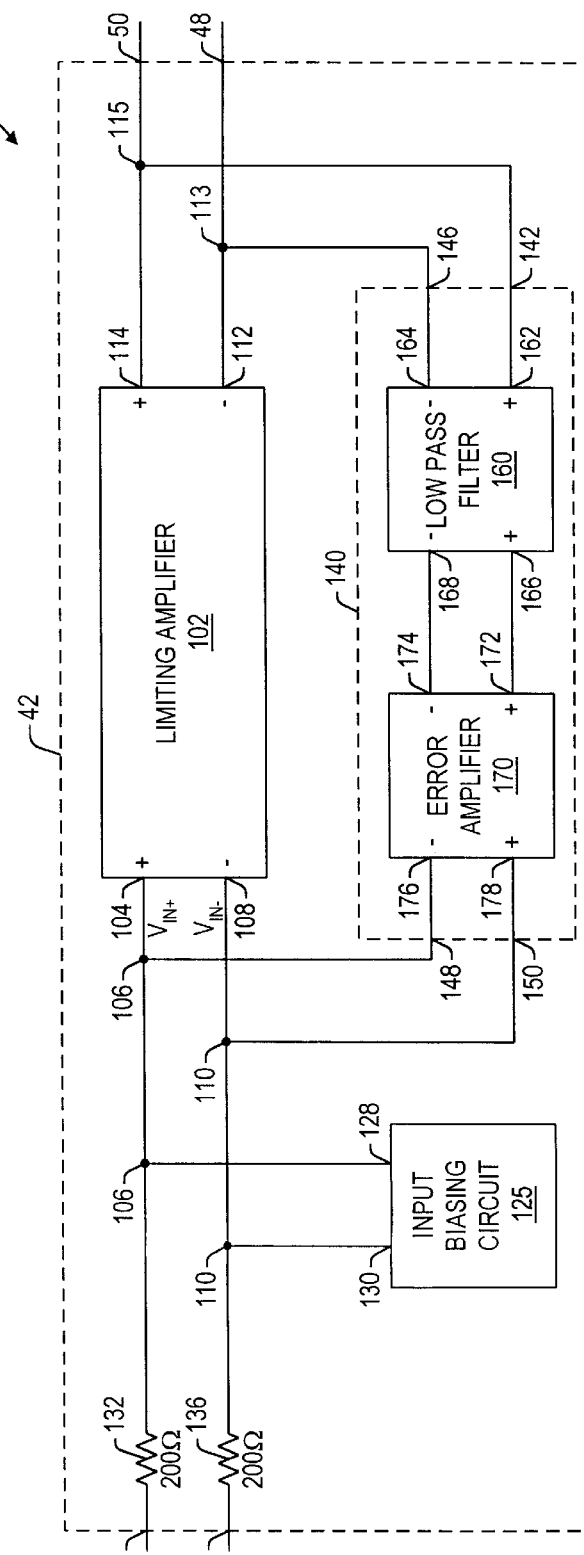
FIG. 2 is a generalized block diagram illustrating components of the limiting amplifier circuit in accordance with the present invention, the limiting amplifier circuit including: an input biasing circuit; and a feed back circuit having a low pass filter, and an error amplifier.
Figure 3:
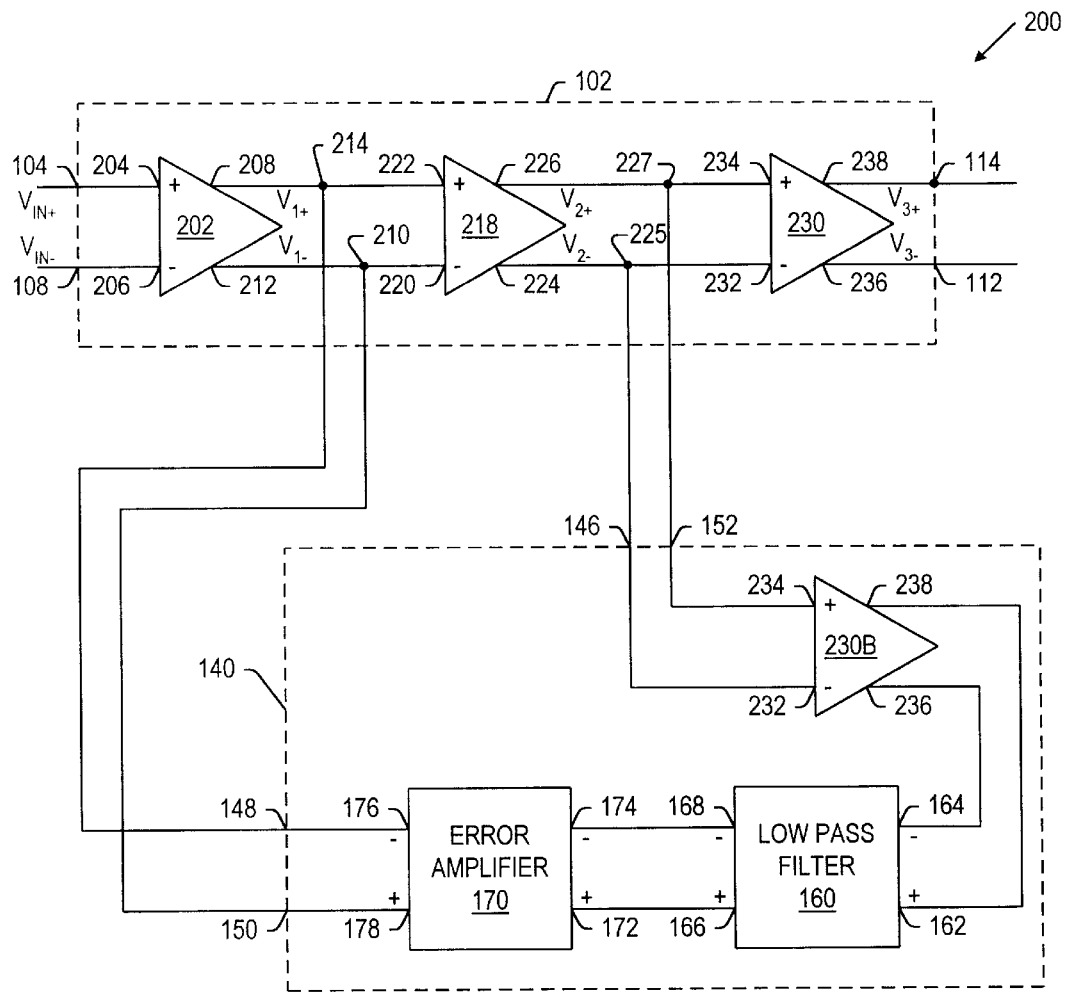
Figure 4A:
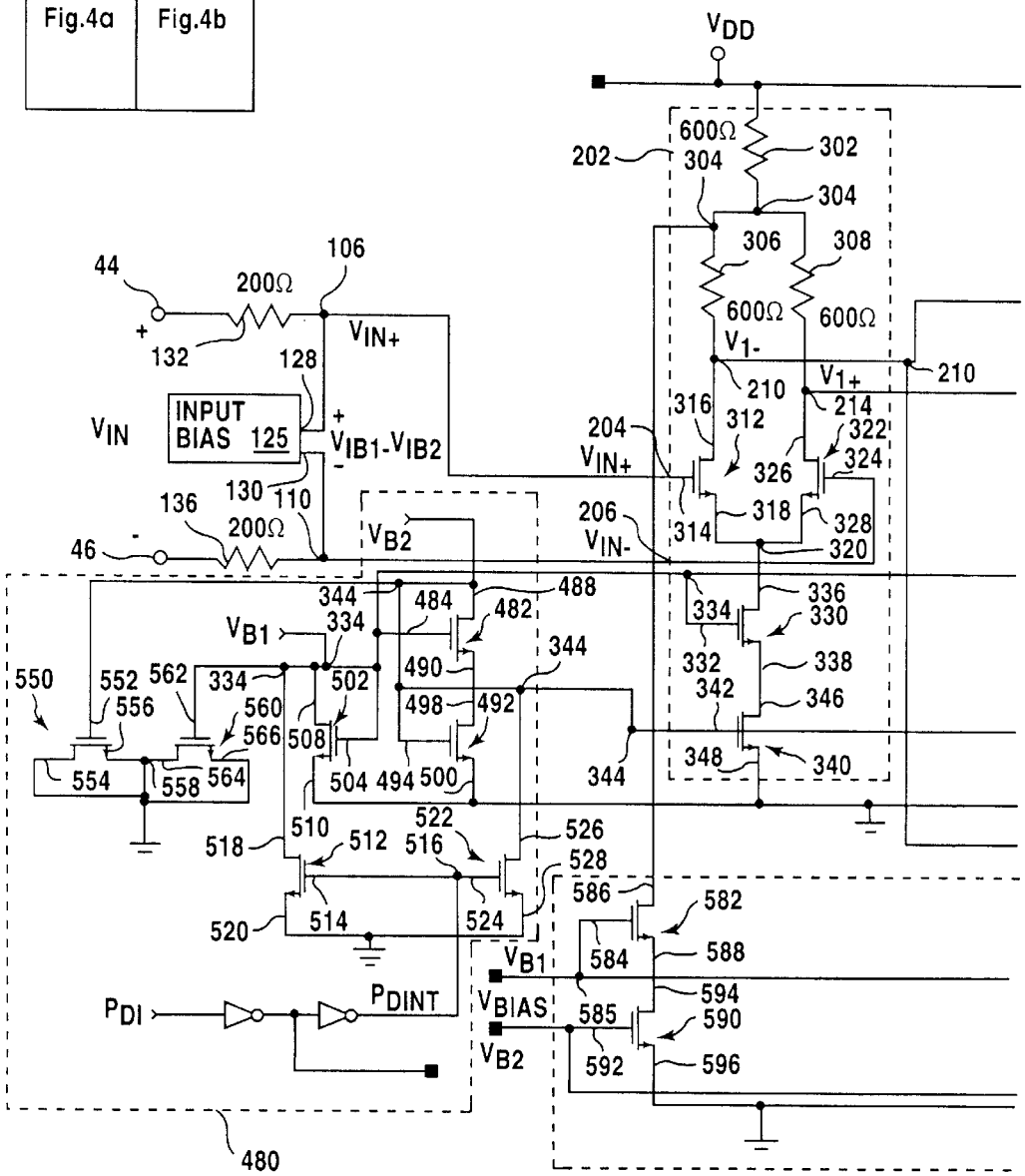
Figure 4B:
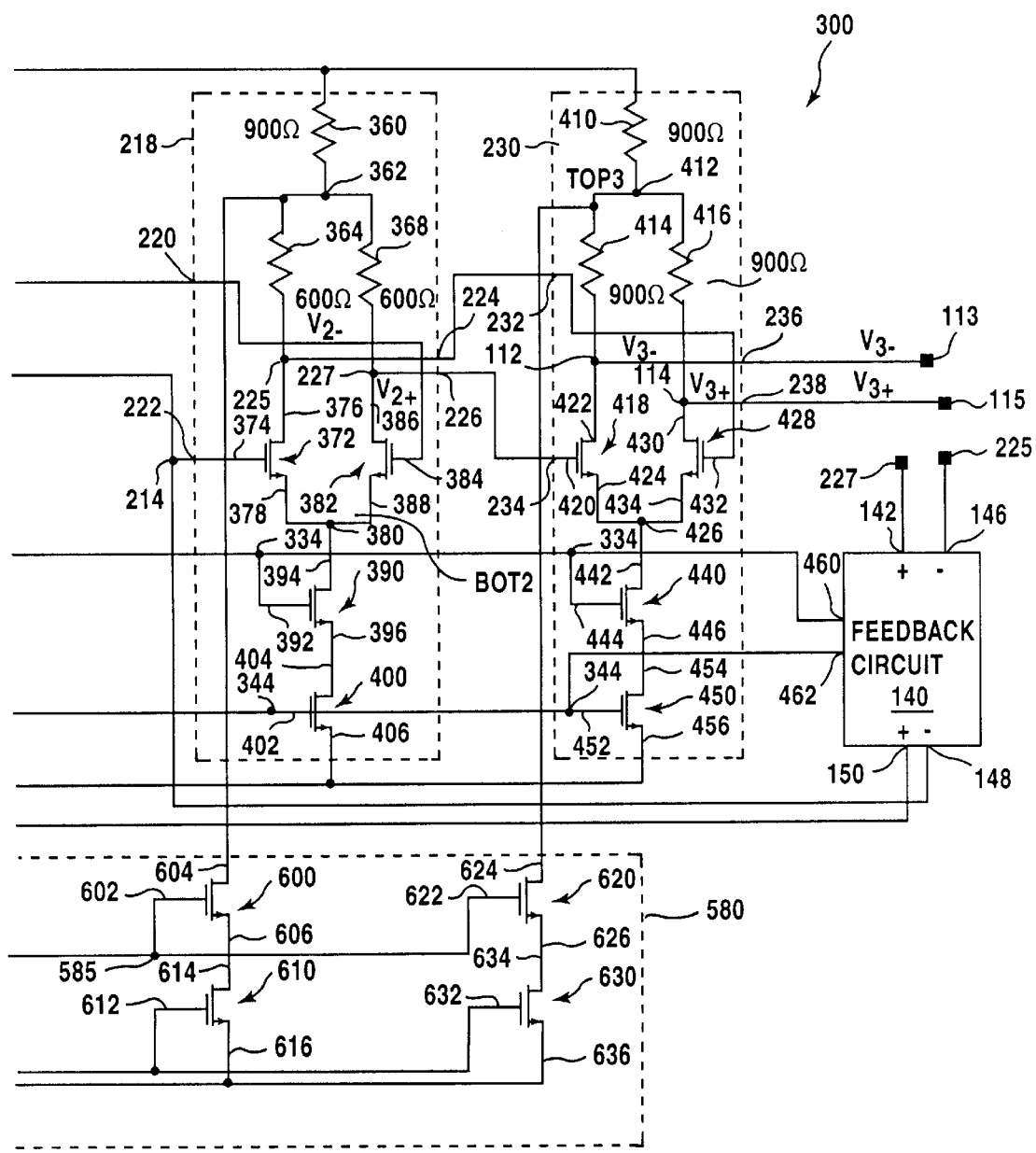
Figure 5A:
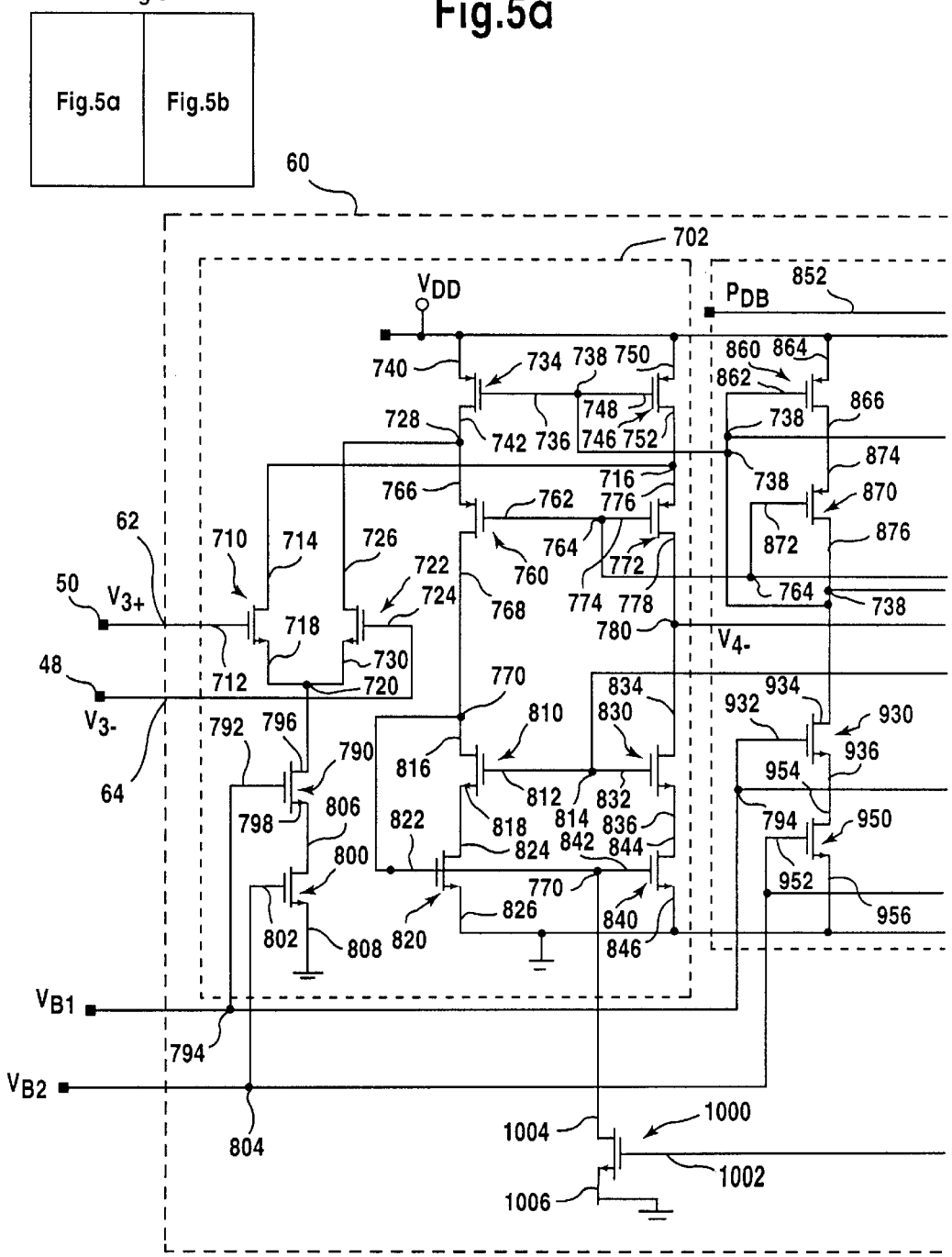
Figure 5B:
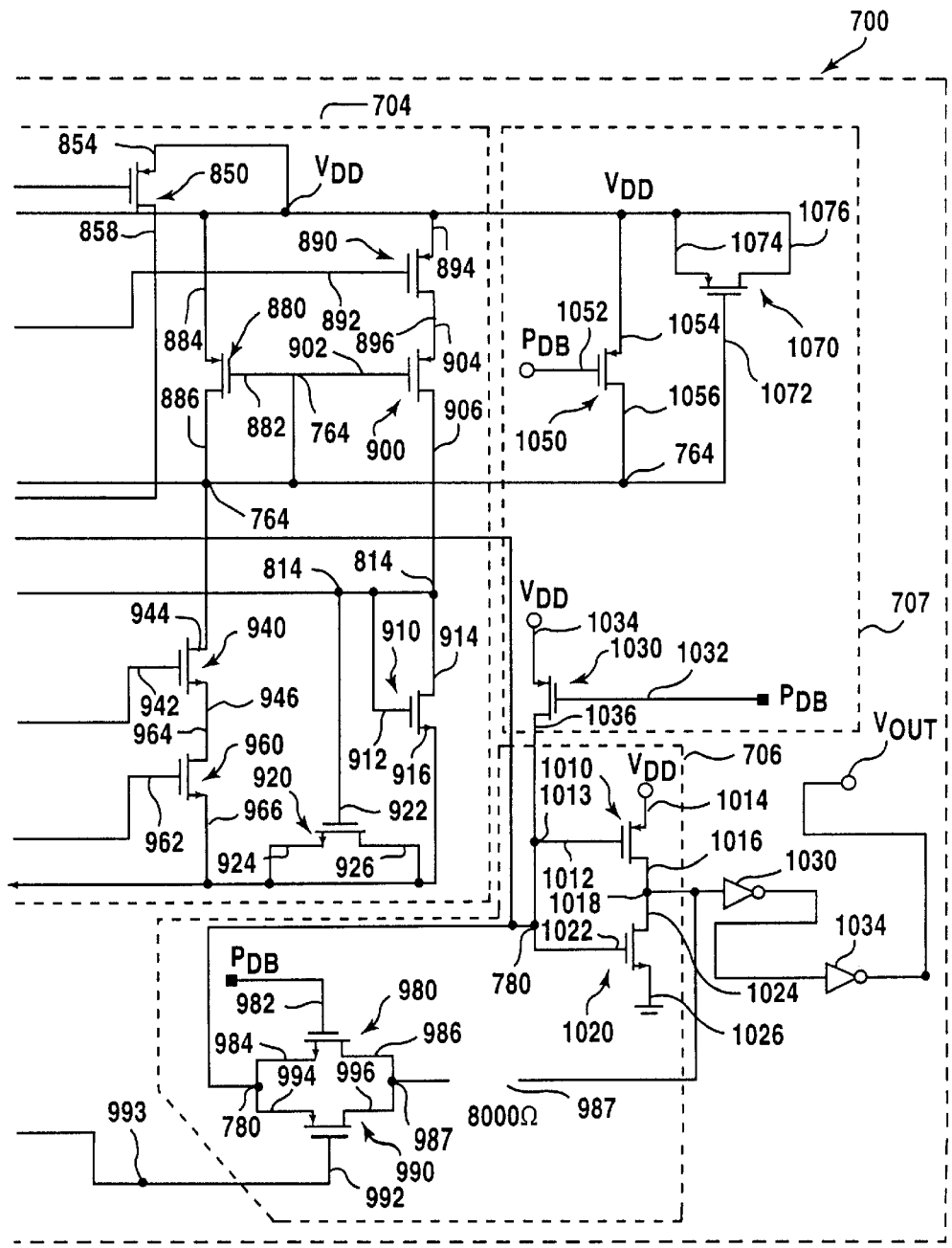
Figure 6A:
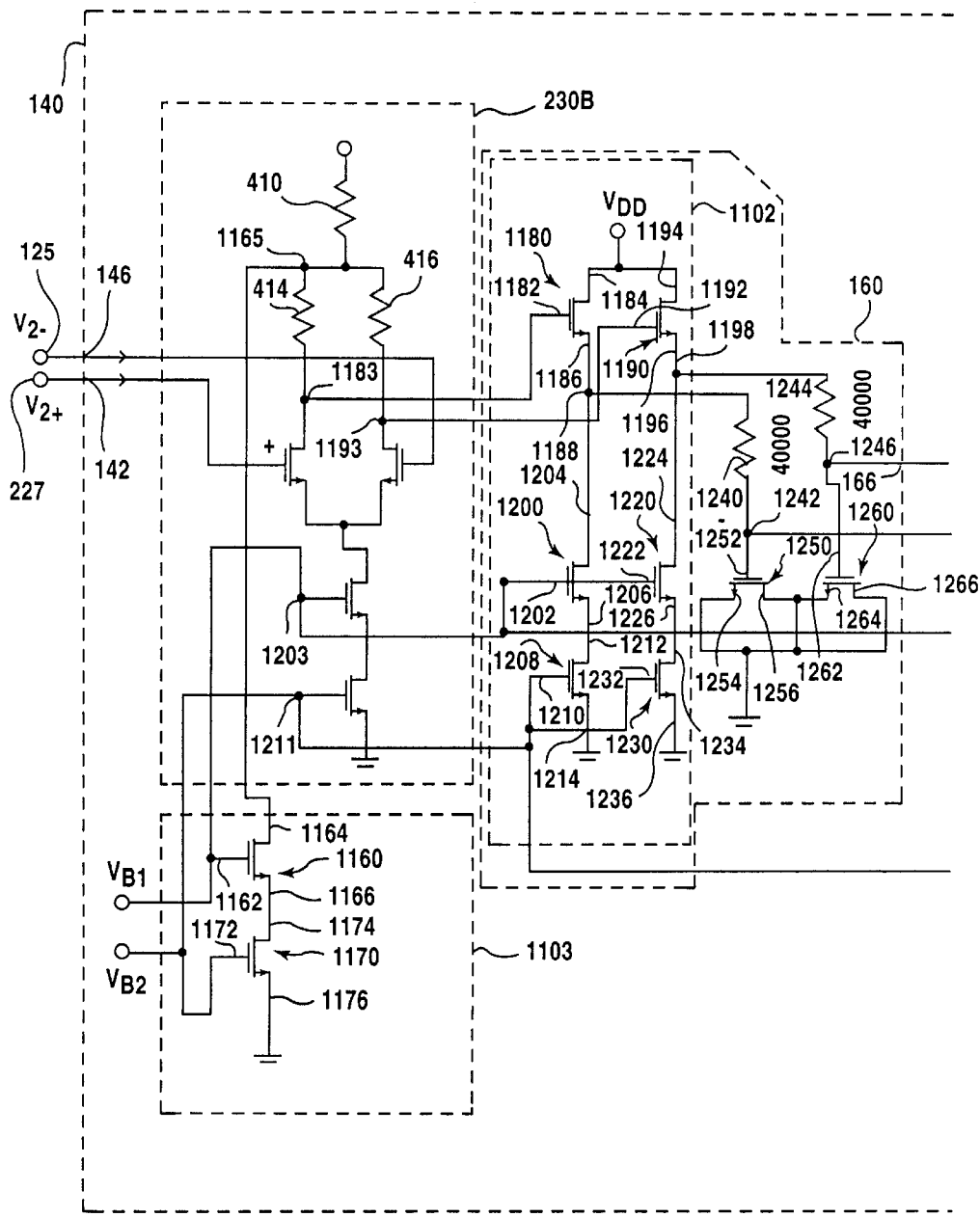
Figure 6B:
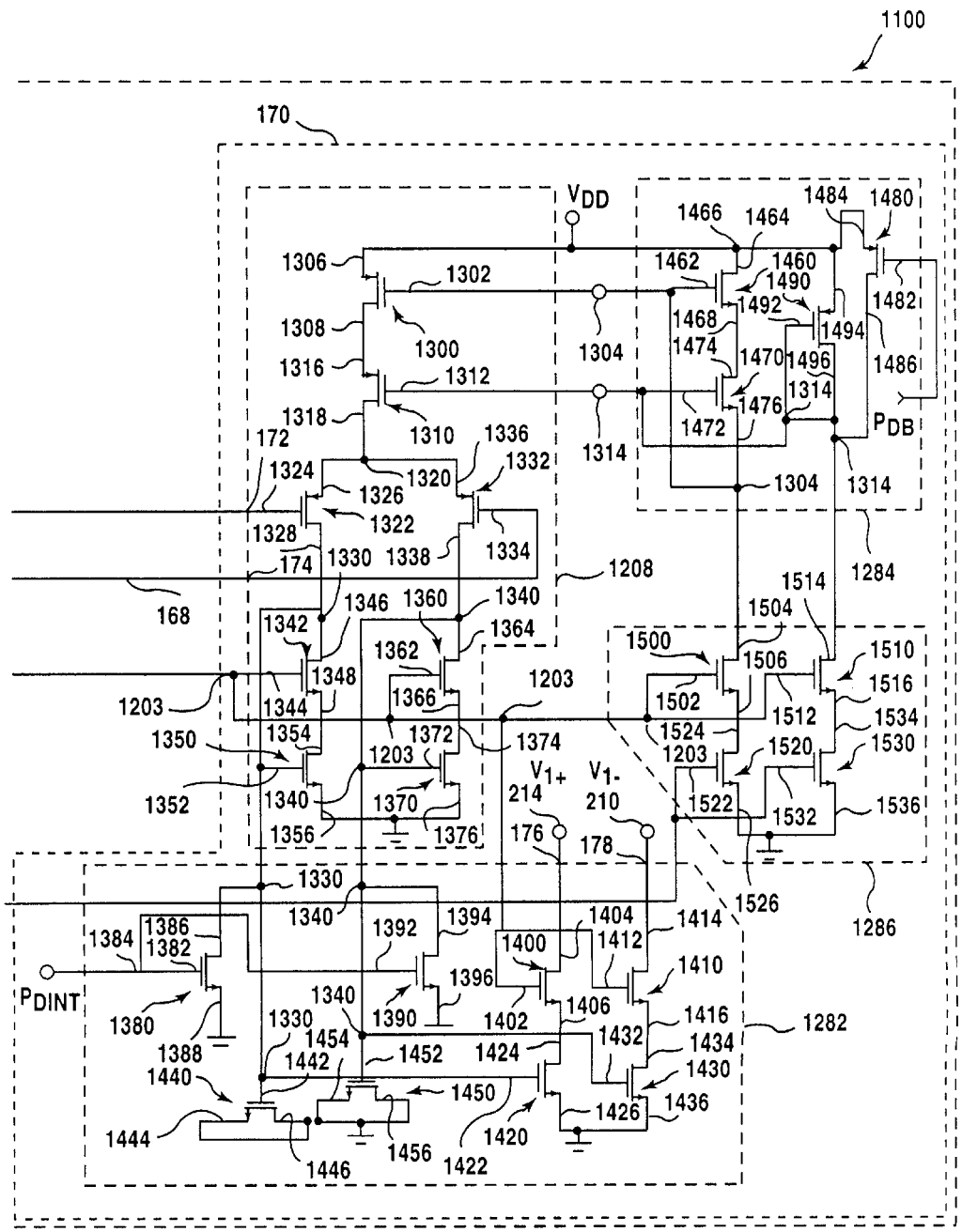
Figure 7:
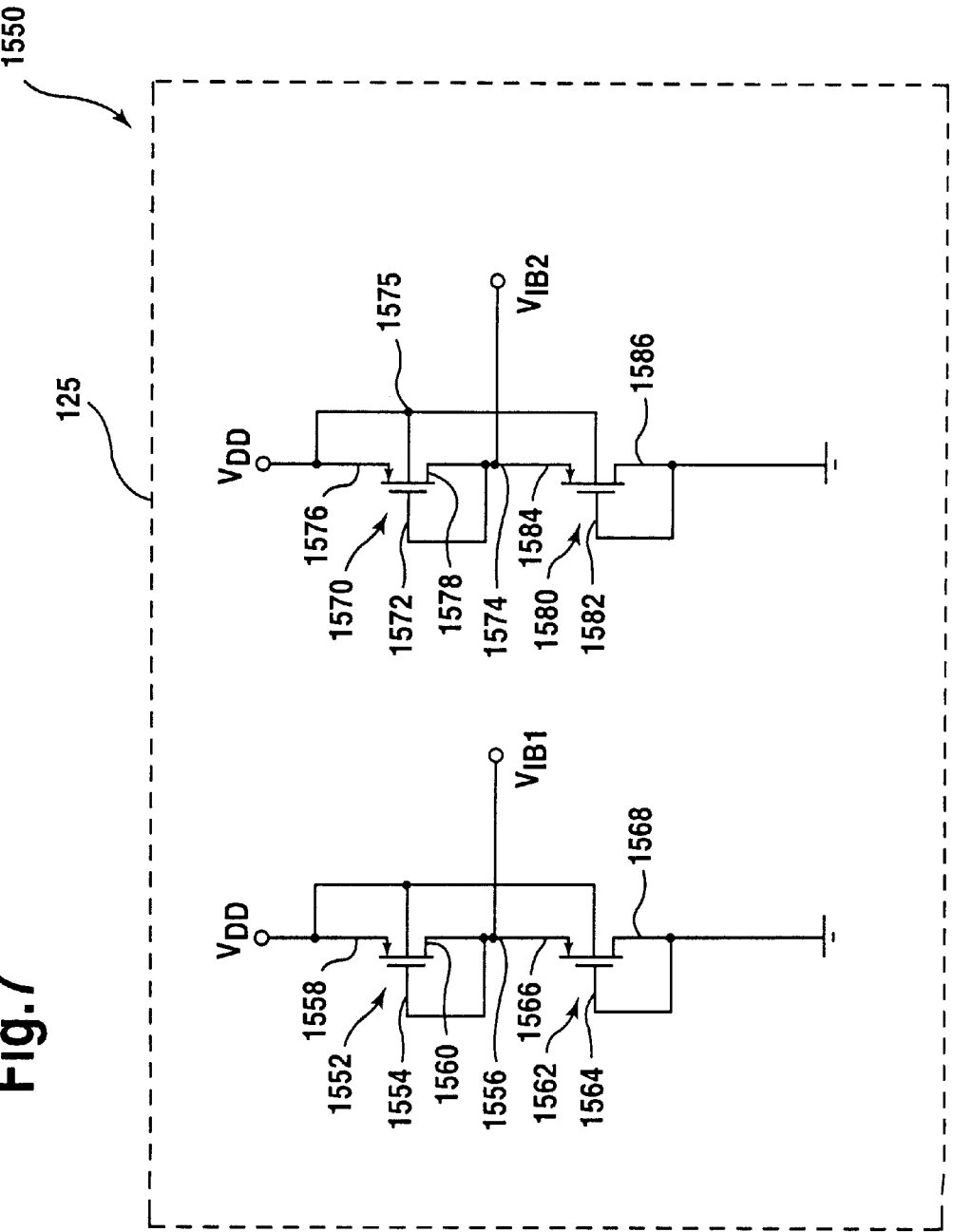

FIG. 3 is a generalized block diagram of one embodiment of the limiting amplifier including three amplifying stages wherein the feed back circuit further includes a feedback amplifying stage substantially similar to the third amplifying stage of the limiting amplifier, the feedback amplifying stage being coupled to receive a signal from the output of the second amplifying stage of the limiting amplifier;

FIGS. 4a and 4b are a schematic circuit diagram illustrating details of the limiting amplifier circuit of FIG. 1;

FIGS. 5a and 5b are a schematic circuit diagram illustrating details of the data slicer circuit of FIG. 1;

FIGS. 6a and 6b are a schematic circuit diagram illustrating details of the feedback circuit of FIG. 2; and FIG. 7 is a schematic circuit diagram illustrating detail of the input biasing circuit of FIG. 2.

DETAILED DESCRIPTION OF THE PREFERRED EMBODIMENTS

The present invention overcomes the problems associated with the prior art by providing a method and apparatus for canceling the voltage offset associated with differential pairs of transistors in a linear amplifier which is used for amplify a data signal having DC balanced coding. Specifically, the present invention describes a CMOS post-amplifier circuit providing automatic temperature independent offset cancellation. In the following description, numerous specific details are set forth (e.g., specific circuit designs and implementation details of a limiting amplifier circuit, a low pass filter, an error amplifier, and a data slicer) in order to provide a thorough understanding of the invention. Those skilled in the art will recognize, however, that the invention may be practiced apart from these specific details. In other instances, well known details of circuits (e.g., the specific functional details of a source couple logic amplifier circuit, and a cascode amplifier circuit) have been omitted, so as not to unnecessarily obscure the present invention.

FIG. 1 shows a block diagram at 10 of a fiber optic signal receiver in accordance with the present invention. The receiver 10 includes: a photodiode 12 having an input port 14 coupled to receive a fiber optic data signal via a fiber optic channel 16, and a positive output terminal 18; a preamplifier 24 having a positive input terminal 26 connected to output terminal 18 of the photodiode, and a positive output terminal 28; and an AC coupling capacitor 30 having a first end 32 connected to a system voltage source, $V_{DD}$, and a second end 34; and a post-amplifying and data slicing circuit 40.

The circuit 40 includes: a limiting amplifier circuit 42 having a positive input terminal 44 connected to output terminal 28 of the preamplifier via an AC coupling capacitor 45, and a negative input terminal 46 connected to the second end 34 of capacitor 30, a positive output terminal 50, and a negative output terminal 48; and a data slicer 60 having a positive input terminal 62 connected to output terminal 50 of the limiting amplifier, a negative input terminal 64 connected to output terminal 48 of the limiting amplifier circuit, and an output port 68. The fiber optic data signal is encoded using DC balanced coding techniques. In one embodiment, the fiber optic channel 16 operates in accordance with Ethernet 100 Base FX protocol.

The limiting amplifier circuit 42 is couple to receive an analog input data signal $V_{IN}$ at its input port which includes terminals 44 and 46, and the circuit 42 is operative to provide an amplified analog data signal at its output port which includes terminals 50 and 48.

The data slicer 60 is responsive to the amplified analog data signal received at its input port including terminals 62, 64, and is operative to generate a digital data signal at its output port 68. The data slicer generates the digital data signal in response to the amplified analog data signal by comparing the differential signal level of the amplified analog data signal. Therefore, the integrity of the amplified analog data signal is very important.

FIG. 2 shows a generalized block diagram at 100 illustrating components of the limiting amplifier circuit 42 in accordance with the present invention. In the depicted embodiment, the limiting amplifier circuit 42 includes: a limiting amplifier 102 having a positive input terminal 104 connected to a node 106, a negative input terminal 108 connected to a node 110, a negative output terminal 112 connected to a node 113, and a positive output terminal 114 connected to a node 115; an input biasing circuit 125 having a first terminal 130 connected to node 110, and a second terminal 128 connected to node 106; a first input resistor 132 having a resistance value of 200 Ohms in one embodiment, and having one end coupled with input terminal 44 of the limiting amplifier circuit, and an opposite end connected to node 106; a second input resistor 136 having a resistance value of 200 Ohms in one embodiment, and having one end connected to input terminal 46 of the limiting amplifier circuit, and an opposite end connected to node 110; and an offset canceling feedback circuit 140 having a positive input terminal 142 connected to the negative output terminal 112 of the limiting amplifier via node 113, a negative input terminal 146 connected to the positive output terminal 114 of the limiting amplifier via node 115, a negative output terminal 148 connected to the positive input terminal 104 of the limiting amplifier via node 106, and a positive output terminal 150 connected to the negative input terminal 108 of the limiting amplifier via node 110.

As further explained below, the feedback circuit 140 is responsive to an amplified analog output signal generated at the output port including terminals 112 and 114 of the limiting amplifier, and is operative to provide an error correcting signal to the input port 104, 108 of the limiting amplifier. The feedback circuit 140 generally includes: a low pass filter 160 having a positive input terminal 162 connected to terminal 114 of the limiting amplifier, a negative input terminal 164 connected to terminal 112 of the limiting amplifier, a positive output terminal 166, and a negative output terminal 168; and an error amplifier 170 having a positive input terminal 172 connected to terminal 166 of the filter, a negative input terminal 174 connected to terminal 168 of the filter, a negative output terminal 176 connected to terminal 104 of the limiting amplifier, and a positive output terminal 178 connected to input terminal 108 of the limiting amplifier.

The input port including terminals 162 and 164 of the low pass filter is coupled to receive an amplified analog data signal from the output port 112, 114 of the limiting amplifier, and is operative to generate a filtered signal at its output port including terminals 166, 168. The error amplifier is responsive to the filtered signal, and operative to provide an error correcting feedback signal to the input port 104, 108 of the limiting amplifier 102. The error correcting feedback signal cancels offset voltage, $V_{OS}$, and DC wandering caused by processing characteristics combined with the effects of temperature variations in the limiting amplifier. Offset voltage and DC wandering are minimized by adjusting the analog input signal received the input port 104, 108 of the limiting amplifier 102 with the error correcting feedback signal.

The negative output terminal 168 of the low pass filter 160 provides a low frequency component of the negative amplified data signal level which is proportional to the average of the negative amplified data signal level because the data signal is a DC balanced data signal. Likewise, the positive output terminal 166 of the low pass filter 160 provides a low frequency component of the positive amplified data signal level which is proportional to the average of the negative amplified data signal level because the data signal is a DC balanced data signal.

FIG. 3 shows a generalized block diagram at 200 of components of the limiting amplifier 102 (FIG. 2), and the offset canceling feedback circuit 140 in accordance with one embodiment of the present invention. In the depicted embodiment, the limiting amplifier 102 includes: a first amplifying stage 202 having a positive input terminal 204, a negative input terminal 206, a positive output terminal 208 connected to a node 214, and a negative output terminal 212 connected to a node 210; a second amplifying stage 218 having a negative input terminal 220 connected to node 210, a positive input terminal 222 connected to node 214, a negative output terminal 224 connected to node 225, and a positive output terminal 226 connected to node 227; and a third amplifying stage 230 having a negative input terminal 232 connected to node 225, a positive input terminal 234 connected to node 227, a negative output terminal 236 connected to output terminal 112 of the limiting amplifier, and a positive output terminal 238 connected to output terminal 114 of the limiting amplifier. The input port of the first amplifying stage 202 which includes terminals 204 and 206 is coupled to receive the analog input data signal $V_{IN+}$. The first amplifying stage 202 is operative to generate a first stage amplified signal $V_1$ at its output port which includes terminals 208 and 212. The second amplifying stage 218 is coupled to receive the first stage amplified signal $V_1$ at its input port which includes terminals 222 and 220. The second amplifying stage 218 is operative to generate a second stage amplified signal $V_2$ at its output port which includes terminals 226 and 224. The third amplifying stage 230 is coupled to receive the second stage amplified signal $V_2$ at its input port which includes terminals 234 and 232. The third amplifying stage 230 is also operative to generate a third stage amplified signal $V_3$ at its output port which includes terminals 238 and 236.

Also in the depicted embodiment, the positive input terminal 152 of the feedback circuit 140 is connected to node 227 of the limiting amplifier, and the negative input terminal 146 of the feedback circuit is connected to node 225 of the limiting amplifier. Further in the depicted embodiment, the feedback circuit 140 includes an amplifying stage 230B, which is substantially similar to the third amplifying stage 230 of the limiting amplifier 102. The amplifying stage 230B has its input port including terminals 232, 234 coupled to receive the second stage amplified signal from the output port including terminals 224, 226 of the second amplifying stage 218 of the limiting amplifier.

Feeding the error correcting signal back to the input port of the second amplifying stage 218 provides an advantage over feeding the error correcting signal back to the input port of the first amplifying stage because the scale of the signal differential at the input port of the second amplifying stage 218 is larger than the scale of the signal differential at the input of the first amplifying stage 202. Because the scale of the signal differential at the input of the second amplifying stage is larger, the method of feeding the error correcting signal back to the input of the second amplifying stage provides improved error tolerance over the method of feeding the error correcting signal back to the input of the first amplifying stage 202 as in conventional amplifier circuits.

FIGS. 4a and 4b show a block diagram at 300 illustrating details of the limiting amplifier 102 (FIG. 2). In the depicted embodiment, the first amplifying stage 202 of the limiting amplifier 102 is configured in accordance with source couple logic, and includes: a resistor 302 having a resistance value of 600 Ohms in one embodiment, and having one end connected to a system voltage source $V_{DD}$, and an opposite end connected to a node 304; a resistor 306 having a resistance value of 600 Ohms in one embodiment, and having one end connected to node 304, and an opposite end connected to node 210 (FIG. 3) of the limiting amplifier; a resistor 308 having a resistance value of 600 Ohms in one embodiment, and having one end connected to node 304, and an opposite end connected to node 214; a first input transistor 312 having a gate 314 connected to receive the input voltage $V_{IN+}$ from the input terminal 204 of the first amplifying stage via node 106, a drain 316 connected to node 210, and a source 318 connected to a node 320; a second input transistor 322 having a gate 324 connected to receive the input voltage $V_{IN-}$ via the terminal 206 of the first amplifying stage 202 via node 110, a drain 326 connected to node 214, and a source 328 connected to node 320; a transistor 330 having a gate 332 connected to a node 334, a drain 336 connected to node 320, and a source 338; and a transistor 340 having a gate 342 connected to a node 344, a drain 346 connected to source 338 of transistor 330, and a source 348 connected to ground.

In the depicted embodiment, the transistors 312, 322, 330, and 340 of the first amplifying stage are all NMOS transistors. In an alternative embodiment, the transistors of the first amplifying stage are all PMOS transistors. Transistors 330 and 340 provide a current source for current biasing the input transistors 312 and 322.

The second amplifying stage 218 is also configured in accordance with source couple logic, and includes: a resistor 360 having a resistance value of 900 Ohms in one embodiment, and having one end connected to $V_{DD}$ and an opposite end connected to a node 362; a resistor 364 having a resistance value of 600 Ohms in one embodiment, and having one end connected to node 362, and an opposite end connected to the node 225 (FIG. 3); a resistor 368 having a resistance value of 600 Ohms in one embodiment, and having one end connected to node 362, and an opposite end connected to node 227 (FIG. 3); an input transistor 372 having a gate 374 connected to node 214 via input terminal 222 of the second amplifying stage 218, a drain 376 connected to node 225, and a source 378 connected to a node 380; an input transistor 382 having a gate 384 connected to node 210 via input terminal 220 of the second amplifying stage, a drain 386 connected to node 227, and a source 388 connected to node 380; a transistor 390 having a gate 392 connected to node 334 to receive a bias signal as further explained below, a drain 394 connected to node 380, and a source 396; and a transistor 400 having a gate 402 connected to node 344 to receive a bias signal as further explained below, a drain 404 connected to source 396 of transistor 390, and a source 406 connected to ground.

In the depicted embodiment, the transistors 372, 382, 390, and 400 of the second amplifying stage are all NMOS transistors. In an alternative embodiment, these transistors may be implemented using PMOS technology. Transistors 390 and 400 provide a current source for current biasing the input transistors 312 and 322. The second amplifying stage generates the second amplified output voltages $V_{2-}$ and $V_{2+}$ at nodes 225 and 227 respectively.

The third amplifying stage 230 is configured in accordance with source couple logic, and includes: a resistor 410 having a resistance value of 900 Ohms in one embodiment, and having one end connected to $V_{DD}$ and an opposite end connected to a node 412; a resistor 414 having a resistance value of 900 Ohms in one embodiment, and having one end connected to node 412, and a opposite end connected to the negative output terminal 112 of the limiting amplifier 102 (FIG. 2); a resistor 416 having a resistance value of 900 Ohms in one embodiment, and having one end connected to node 412, and an opposite end connected to the positive output terminal 114 of the limiting amplifier 102 (FIG. 2); a first input transistor 418 having a gate 420 connected to node 227 via the positive input terminal 234 of the third amplifying stage 230, a drain 422 connected to node 112, and a source 424 connected to a node 426; a second input transistor 428 having a gate 432 connected to node 225 via the negative input terminal 232 of the third amplifying stage, a drain 430 connected to node 114, and a source 434 connected to node 426; a transistor 440 having a gate 444 connected to node 334, a drain 442 connected to node 426, and a source 446; and a transistor 450 having a gate 452 connected to node 344 which is connected to an input 462 of the feedback circuit 140, a drain 454 connected to source 446 of transistor 440, and a source 456 connected to ground.

In the depicted embodiment, the transistors 418, 428, 440, and 450 of the third amplifying stage are all NMOS transistors. As is well understood in the art, in an alternative embodiment, these transistors may be implemented using PMOS technology. Transistors 440 and 450 provide a current source for current biasing the input transistors 418 and 428. The third amplifying stage generates the third amplified output voltages $V_{3-}$ and $V_{3+}$ at nodes 112 and 114 respectively.

The limiting amplifier further includes a biasing circuit 480 including: an NMOS transistor 482 having a gate 484 connected to receive a first bias voltage $V_{B1}$ from a temperature compensating bandgap reference generator (not shown) which is implemented in accordance with well known methods, node 486, a drain 488 connected to a second bias voltage $V_{B2}$ from the reference generator (not shown), and a source 490; an NMOS transistor 492 having a gate 494 connected to a node 344 connected to $V_{B2}$, a drain 498 connected to source 490 of transistor 482, and a source 500 connected to ground; an NMOS transistor 502 having a gate 504 connected to node 334, a drain 508 connected to node 334, and a source 510 connected to ground; an NMOS transistor 512 having a gate 514 connected to a node 516, a drain 518 connected to node 334, and a source 520 connected to ground; an NMOS transistor 522 having a gate 524 connected to node 516, a drain 526 connected to node 344, and a source 528 ground; an NMOS transistor 550 having a gate 552 connected to receive the second bias voltage $V_{B2}$ via node 344, a drain 554 connected to ground, and a source 556 connected to a node 558; an NMOS transistor 560 having a gate 562 connected to node 344, a drain 564 connected to node 558, and a source 566 connected to ground. The biasing circuit 480 provide current to voltage conversion for proper biasing of the current biasing transistor 330, 340, 390, 400, 440, and 450 of the amplifying stages. The band gap reference generator (not shown) may be implemented in accordance with well known methods.

The depicted limiting amplifier circuit 42 further includes a DC biasing circuit 580 including: an NMOS transistor 582 having a gate 584 connected to $V_{B1}$ via a node 585, a drain 586 connected to node 304 of the first amplifying stage 202, and a source 588; an NMOS transistor 590 having a gate 592 connected to receive the second bias voltage $V_{B2}$, a drain 594 connected to source 588 of transistor 582, and a source 596 connected to ground; an NMOS transistor 600 having a gate 602 connected to node 585, a drain 604 connected to node 362 of the second amplifying stage 218, and a source 606; an NMOS transistor 610 having a gate 612 connected to receive the second bias voltage $V_{B2}$, a drain 614 connected to source 606 of transistor 600, and a source 616 connected to $V_{B2}$; an NMOS transistor 620 having a gate 622 connected 585, a drain 624 connected to node 412 of the third amplifying stage 230, and a source 626; and an NMOS transistor 630 having a gate 632 connected to ground, a drain 634 connected to source 626 of transistor 620, and a source 636 connected to ground. The DC biasing circuit 580 provides quiescent DC biasing of the amplifying stages 202, 218, and 230.

The feedback circuit 140 further includes a biasing input terminal 460 connected to received the first bias signal $V_{B1}$ via node 334, and a second biasing input terminal 462 connected to receive the second bias voltage $V_{B2}$ via node 344. As also shown in FIG. 3, terminals 152 and 146 forming the input port of the feedback circuit 140 are connected to nodes 227 and 225 respectively to receive the second stage amplified signal $V_2$ from the second amplifying stage 218.

Table 1 below, shows transistor characteristics of each of the above recited transistors of FIGS. 4a and 4b.

TABLE 1

| Transistor Ref. No. | W (Channel Width) | L (Channel Length) | M (Multiple factor of Channel Width) |
|---|---|---|---|
| 312 | 20 | 0.5 | 18 |
| 322 | 20 | 0.5 | 18 |
| 330 | 12 | 0.7 | 22 |
| 340 | 12 | 2.4 | 22 |
| 372 | 20 | 0.5 | 6 |
| 382 | 20 | 0.5 | 6 |
| 390 | 12 | 0.7 | 16 |

TABLE 1-continued

| Transistor Ref. No. | W (Channel Width) | L (Channel Length) | M (Multiple factor of Channel Width) |
|---|---|---|---|
| 400 | 12 | 2.4 | 16 |
| 418 | 20 | 0.6 | 6 |
| 428 | 20 | 0.6 | 6 |
| 440 | 12 | 0.7 | 10 |
| 450 | 12 | 2.4 | 10 |
| 482 | 12 | 0.7 | 2 |
| 492 | 12 | 2.4 | 2 |
| 502 | 10 | 2.4 | 1 |
| 512 | 6 | 0.6 | 1 |
| 522 | 6 | 0.6 | 1 |
| 550 | 40 | 10 | 1 |
| 560 | 40 | 10 | 1 |
| 582 | 12 | 0.7 | 8 |
| 590 | 12 | 2.4 | 8 |
| 600 | 12 | 0.7 | 4 |
| 610 | 12 | 2.4 | 4 |
| 620 | 12 | 0.7 | 8 |
| 630 | 12 | 2.4 | 8 |

FIGS. 5a and 5b show a schematic circuit diagram at 700 illustrating details of the data slicer circuit 60 (FIG. 2). In the depicted embodiment, the data slicer includes: a folded cascode amplifying circuit 702, a biasing circuit 704 for biasing the folded cascode amplifier, and an inverting amplifier circuit 706. The folded cascode amplifying circuit 702 includes: a first input transistor 710, which is an NMOS transistor in the depicted embodiment, having a gate 712 connected to the output terminal 50 of the limiting amplifier circuit 42 (FIG. 1), a drain 714 connected to a node 716, and a source 718 connected to a node 720; a second input transistor 722, which is an NMOS transistor in the depicted embodiment, having a gate 724 connected to the output terminal 48 of the limiting amplifier circuit 42 (FIG. 1), a drain 726 connected to a node 728, and a source 730 connected to node 720; a PMOS loading transistor 734 having a gate 736 connected to a node 738, a source 740 connected to $V_{DD}$, and a drain 742 connected to node 728; a PMOS loading transistor 746 having a gate 748 connected to node 738, a source 750 connected to $V_{DD}$, and a drain 752 connected to node 716; a PMOS cascode transistor 760 having a gate 762 connected to a node 764, a source 766 connected to node 728, and a drain 768 connected to a node 770; a PMOS cascode transistor 772 having a gate 774 connected to node 764, a source 776 connected to node 716, and a drain 778 connected to a node 780; an NMOS transistor 790 having a gate 792 connected to $V_{B1}$ via a node 794, a drain 796 connected to node 720, and a source 798; an NMOS transistor 800 having a gate 802 connected to $V_{B2}$ via a node 804, a drain 806 connected to source 798 of transistor 790, and a source 808 connected to ground; an NMOS cascode transistor 810 having a gate 812 connected to a node 814, a drain 816 connected to node 770, and a source 818; an NMOS transistor 820 having a gate 822 connected to node 770, a drain 824 connected to source 818 of transistor 810, and a source 826 connected to ground; an NMOS cascode transistor 830 having a gate 832 connected to node 814, a drain 834 connected to node 780, and a source 836; an NMOS transistor 840 having a gate 842 connected to node 770, a drain 844 connected to source 836 of transistor 830, and a source 846 connected to ground.

The loading transistors 734 and 746 provide loading for the folded cascode amplifier 702. Transistors 820 and 840 provide adaptive current switching for the cascode amplifier. An output $V_{4-}$ of the folder cascade amplifier 702 is provided at node 780.

The biasing circuit 704 includes: a PMOS transistor 850 having a gate 852 connected to receive a power-down voltage PDB, a source 854 connected to $V_{DD}$, and a drain 858 connected to node 738; a PMOS transistor 860 having a gate 862 connected to node 738, a source 864 connected to $V_{DD}$, and a drain 866; a PMOS transistor 870 having a gate 872 connected to node 764 of the cascode amplifier, a source 874 connected to drain 866 of transistor 860, and a drain 876 connected to node 738; a PMOS transistor 880 having a gate 882 connected to node 764, a source 884 connected to $V_{DD}$, and a drain 886 connected to node 764; a PMOS transistor 890 having a gate 892 connected to node 738, a source 894 connected to $V_{DD}$, and a drain 896; a PMOS transistor 900 having a gate 902 connected to node 764, a source 904 connected to drain 896 of transistor 890, and a drain 906 connected to node 814; an NMOS transistor 910 having a gate 912 connected to node 814, a drain 914 also connected to node 814, and a source 916 connected to ground; an NMOS transistor 920 having a gate 922 connected to node 814, a source 924 connected to ground, and a drain 926 also connected to ground; an NMOS transistor 930 having a gate 932 connected to $V_{B1}$ via node 794, a drain 934 connected to node 738, and a source 936; an NMOS transistor 940 having a gate 942 connected to node 794, a drain 944 connected to node 764, and a source 946; an NMOS transistor 950 having a gate 952 connected to $V_{B2}$ via node 804, a drain 954 connected to source 936 of transistor 930, and a source 956 connected to ground; an NMOS transistor 960 having a gate 962 connected to node 804, a drain 964 connected to source 946 of transistor 940, and a source 966 connected to ground. Transistors 930, 940, 950, and 960 provide voltage to current conversion for the cascode amplifier. Transistors 860, 870, 880, 890, and 900 provide current to voltage conversion for the cascode amplifier.

The inverting amplifier circuit 706 includes an NMOS transistor 980 having a gate 982 connected to receive the power-down voltage PDB, a source 984 connected to node 780 of the cascoding amplifier, and a drain 986 connected to a node 987; a PMOS transistor 990 having a gate 992 connected to a node 993, a source 994 connected to node 780, and a drain 996 connected to node 987; a PMOS transistor 1010 having a gate 1012 connected to a node 1013, a source connected to $V_{DD}$, and a drain 1016 connected to a node 1018; a transistor 1020 having gate 1022 connected to node 780, a drain 1024 connected to node 1018, and a source 1026 connect to ground. Transistors 1010 and 1020 of the inverting amplifier circuit 706 provide a transimpedance amplifier (with resistive feedback via resistor 987) for biasing the output node 780 of the cascode amplifier 702. Transistor 980 and 990 provide a switch for conserving power when the circuit is not in use.

The depicted data slicer circuit 60 further includes: an NMOS transistor 1000 having a gate 1002 connected to node 993, a drain 1004 connected to node 770 of the cascoding amplifier, and a source 1006 connected to ground.

The power down circuit 707 includes: a PMOS transistor 1030 having a gate 1032 connected to PDB, a source 1034 connected to $V_{DD}$, and a drain 1036 connected to node 1013; a transistor 1050 having a gate 1052 connected to PDB, a source 1054 connected to $V_{DD}$, and a drain connected to node 764; and a transistor 1070 having a gate 1072 connected to $V_{DD}$.

Table 2, below, shows transistor characteristics of each of the above recited transistors of FIGS. 5a and 5b.

TABLE 2

| Transistor Ref. No. | W (Channel Width) | L (Channel Length) | M (Multiple factor of Channel Width) |
| --- | --- | --- | --- |
| 710 | 20 | 0.5 | 4 |
| 722 | 20 | 0.5 | 4 |
| 734 | 12 | 2.4 | 8 |
| 746 | 12 | 2.4 | 8 |
| 760 | 12 | 0.7 | 8 |
| 772 | 12 | 0.7 | 8 |
| 790 | 12 | 0.7 | 6 |
| 800 | 12 | 2.4 | 6 |
| 810 | 4 | 0.7 | 8 |
| 820 | 4 | 2.4 | 8 |
| 830 | 4 | 0.7 | 8 |
| 840 | 4 | 2.4 | 8 |
| 850 | 8 | 0.6 | 1 |
| 860 | 12 | 2.4 | 2 |
| 870 | 12 | 0.7 | 2 |
| 880 | 10 | 2.4 | 1 |
| 890 | 12 | 2.4 | 2 |
| 900 | 12 | 0.7 | 2 |
| 910 | 3.6 | 2.4 | 1 |
| 920 | 20 | 4.9 | 2 |
| 930 | 12 | 0.7 | 2 |
| 940 | 12 | 0.7 | 2 |
| 950 | 12 | 2.4 | 2 |
| 960 | 12 | 2.4 | 2 |
| 980 | 2 | 0.5 | 1 |
| 990 | 6 | 0.6 | 1 |
| 1000 | 6 | 0.6 | 1 |
| 1010 | 20 | 0.6 | 1 |
| 1020 | 7 | 0.5 | 1 |
| 1030 | 8 | 0.6 | 1 |
| 1050 | 8 | 0.6 | 1 |
| 1070 | 10 | 20 | 1 |

FIGS. 6a and 6b show a schematic circuit diagram at 1100 illustrating details of the feedback circuit 140 (FIG. 2). In the depicted embodiment, the feedback circuit 140 includes: the amplifying stage 230B, (FIG. 3), the low pass filter 160 having a level shifting circuit 1102 coupled to receive the signal generated at the output port including terminals 236, 238 (FIG. 3) of the amplifying stage 230B, and the error amplifier 170 as further explained below. The amplifying stage 230B is substantially similar to the third amplifying stage 230 described above, and includes all of the of the components of the third amplifying stage shown at 300 in FIGS. 4a and 4b. A biasing circuit 1103 provides biasing of the extra amplifying stage 2301B and includes: an NMOS transistor 1160 having a gate, 1162 connected to $V_{B1}$, a drain 1164 connected to a node 1165 of the extra amplifying stage 230B, and a source 1166; an NMOS transistor 1170 having a gate 1172 connected to $V_{B2}$, a drain 1174 connected to the source 1166 of transistor 1160, and a source connected to ground.

The level shifting circuit 1102 includes: an NMOS transistor 1180 having a gate 1182 connected to a node 1183 of the extra amplifying stage 230B, a drain 1184 connected to $V_{DD}$, and a source 1186 connected to a node 1188; an NMOS transistor 1190 having a gate 1192 connected to a node 1193 of the extra amplifying stage 2301B, a drain 1194 connected to $V_{DD}$, and a source 1196 connected to a node 1198; an NMOS transistor 1200 having a gate 1202 connected to a node 1203 of the extra amplifying stage and connected to $V_{B1}$, a drain 1204 connected to node 1188, and the source 1206; an NMOS transistor 1208 having a gate 1210 connected a node 1211 of the extra amplifying stage which is connected to $V_{B2}$, a drain 1212 connected to source 1206 of transistor 1200, and a source 1214 connected to ground; an NMOS transistor 1220 having a gate 1222 connected to node 1203, a drain 1224 connected to node 1198, and a source 1226; an NMOS transistor 1230 having a gate 1232 connected to node 1211 to receive the second bias voltage $V_{B2}$, a drain 1234 connected to source 1226 of transistor 1220, and a source 1236 connected to ground. The level shifting circuit 1102 provides additional level shifting for the input to the error amplifier 170.

The low pass filter 160 further includes a resistor 1240 having a resistance value of 40,000 Ohms in one embodiment, and having one end connected to node 1188, and an opposite end connected to a negative output node 1242 of the low pass filter which is connected to the negative output terminal 168 (FIG. 2) of the low pass filter; a resistor 1244 having a resistance value of 40,000 Ohms in one embodiment, and having a first end connected to node 1198 and an opposite end connected to a positive output node 1246 of the low pass filter which is connected to the positive output terminal 166 (FIG. 2) of the low pass filter; an NMOS transistor 1250 having a gate 1252 connected to node 1242, a source 1254 connected to ground, and a drain 1256 connected to ground; and an NMOS transistor 1260 having a gate 1262 connected to node 1246, a source 1264 connected to ground, and a drain 1266 connected to ground.

In the depicted embodiment, the low pass filter 160 is implemented as a first order passive low pass filter. In an alternative embodiment, the low pass filter may be implemented as a second order active low pass filter.

The error amplifier 170 includes a transconductance amplifier 1280, a current mirror circuit 1282 for adjusting the gain of the error amplifier 170, a first biasing circuit 1284, and a second biasing circuit 1286. The transconductive amplifier 1280 includes: a PMOS transistor 1300 having a gate 1302 connected to a node 1304, a source 1306 connected to $V_{DD}$, and a drain 1308; a PMOS transistor 1310 having a gate 1312 connected to a node 1314, a source 1316 connected to drain 1308 of transistor 1300, and a drain 1318 connected to a node 1320; a PMOS transistor 1322 having a gate 1324 connected to the positive output node 1246 of the low pass filter 160 via its positive output terminal 166, a source 1326 connected to node 1320, and a drain 1328 connected to a node 1330; a PMOS transistor 1332 having a gate 1334 connected to the negative output node 1242 of the low pass filter 160, a source 1336 connected to node 1320, and a drain 1338 connected to a node 1340; an NMOS transistor 1342 having a gate 1344 connected to node 1203, a drain 1346 connected to node 1330, and a source 1348; an NMOS transistor 1350 having a gate 1352 connected to node 1330, a drain 1354 connected to source 1348 of transistor 1342, and a source 1356 connected to ground; an NMOS transistor 1360 having a gate 1362 connected to node 1203, a drain 1364 connected to node 1340, and a source 1366; and an NMOS transistor 1370 having a gate 1372 connected to node 1340, a drain 1374 connected to source 1366 of transistor 1360, and a source 1376 connected to ground.

The transconductance amplifier 1280 is configured in accordance with source couple logic. Input transistors 1322 and 1332 are designed to be low offset input transistor. These transistors have an increased channel length which affords lower offset at the cost of greater capacitive loading. However, the increased capacitive loading is not problematic because the signal received at transistors 1322 and 1332 from the output nodes 1246 and 1242 of the low pass filter is a low frequency signal. Transistors 1350, 1370, 1420, and 1430 are sized to match transistors 1322 and 1332.

The current mirror circuit 1282 includes: an NMOS transistor 1380 having a gate 1382 connected to receive power down signal PDINT via a node 1384, a drain 1386 connected to node 1330, and a source 1388 connected to ground; an NMOS transistor 1390 having a gate 1392 connected to node 1384, a drain 1394 connected to node 1340, and a source 1396 connected to ground; an NMOS transistor 1400 having a gate 1402 connected to node 1203, a drain 1404 connected to the positive node 214 (FIG. 3) connected to the positive input terminal 222 of the second amplifying stage 202 (FIG. 3), and a source 1406; an NMOS transistor 1410 having a gate 1412 connected to node 1203, a drain 1414 connected to the negative node 210 (FIG. 3) connected to the negative input terminal 220 of the second amplifying stage 202 (FIG. 3), and a source 1416; an NMOS transistor 1420 having a gate 1422 connected to node 1330, a drain 1424 connected to source 1406 of transistor 1400, and a source 1426 connected to ground; an NMOS transistor 1430 having a gate 1432 connected to node 1340, a drain 1434 connected to source 1416 of transistor 1410, and a source 1436 connected to ground; an NMOS transistor 1440 having a gate 1442 connected to node 1330, a source 1444 connected to ground, and a drain 1446 connected ground; and an NMOS transistor 1450 having a gate 1452 connected to node 1340, a source 1454 connected to ground, and a drain 1456 connected to ground. Transistors 1420 and 1430 are designed to be proportionally larger than transistors 1350 and 1370 respectively in order to provide an optimal feedback gain for the transconductive amplifier 1280.

The first biasing circuit 1284 includes: a PMOS transistor 1460 having a gate 1462 connected to gate 1302 of transistor 1300 via node 1304, a source 1464 connected to $V_{DD}$, and a drain 1468; a PMOS transistor 1470 having a gate 1472 connected to gate 1312 of transistor 1310 of the transconductance amplifier circuit, a source 1474 connected to drain 1468 of transistor 1460, and a drain 1476 connected to node 1304; a PMOS transistor 1480 having a gate 1482 connected to receive a system voltage source PDB, a source 1484 connected to $V_{DD}$, and a drain 1486 connected to node 1314; a PMOS transistor 1490 having a gate 1492 connected to gate 1314, a source 1494 connected to $V_{DD}$, and a drain 1496 connected to node 1314.

The second biasing circuit 1286 includes: an NMOS transistor 1500 having a gate 1502 connected to node 1203, a drain 1504 connected to node 1304 of the first biasing circuit 1284, and a source 1506; an NMOS transistor 1510 having a gate 1512 connected to node 1203 to receive the first bias voltage $V_{B1}$, a drain 1514 connected to node 1314 of circuit 1284, and a source 1516; an NMOS transistor 1520 having a gate 1522 connected to node 1211 to receive the second bias voltage $V_{B2}$, a drain 1524 connected to source 1506 of transistor 1500, and a source 1526 connected to ground; an NMOS transistor 1530 having a gate 1532 connected to receive the second bias voltage $V_{B2}$, a drain 1534 connected to source 1516 of transistor 1510, and a source 1536 connected to ground.

The first biasing circuit 1284 provides current to voltage conversion for the transconductance amplifier 1280. The second biasing circuit 1286 provides voltage to current conversion for the transconductance amplifier 1280.

Table 3, below, shows transistor characteristics of each of the above recited transistors of FIGS. 6a and 6b.

TABLE 3

| Transistor Ref. No. | W (Channel Width) | L (Channel Length) | M (Multiple factor of Channel Width) |
|---|---|---|---|
| 1160 | 12 | 0.7 | 8 |
| 1170 | 12 | 2.4 | 8 |
| 1180 | 20 | 2 | 8 |
| 1190 | 20 | 2 | 8 |
| 1200 | 12 | 0.7 | 2 |
| 1208 | 12 | 2.4 | 2 |
| 1220 | 12 | 0.7 | 2 |
| 1230 | 12 | 2.4 | 2 |
| 1250 | 20 | 4.9 | 120 |
| 1260 | 20 | 4.9 | 120 |
| 1300 | 24 | 2.4 | 2 |
| 1310 | 24 | 0.7 | 2 |
| 1322 | 20 | 1.2 | 12 |
| 1332 | 20 | 1.2 | 12 |
| 1342 | 12 | 0.7 | 2 |
| 1350 | 12 | 2.4 | 2 |
| 1360 | 12 | 0.7 | 2 |
| 1370 | 12 | 2.4 | 2 |
| 1380 | 6 | 0.6 | 1 |
| 1390 | 6 | 0.6 | 1 |
| 1400 | 12 | 0.7 | 4 |
| 1410 | 12 | 0.7 | 4 |
| 1420 | 12 | 2.4 | 4 |
| 1430 | 12 | 2.4 | 4 |
| 1440 | 20 | 4.9 | 2 |
| 1450 | 20 | 4.9 | 2 |
| 1460 | 24 | 2.4 | 2 |
| 1470 | 24 | 0.7 | 2 |
| 1480 | 8 | 0.6 | 1 |
| 1490 | 10 | 2.4 | 2 |
| 1500 | 12 | 0.7 | 2 |
| 1510 | 12 | 0.7 | 2 |
| 1520 | 12 | 2.4 | 2 |
| 1530 | 12 | 2.4 | 2 |

FIG. 7 shows a schematic diagram at 1550 of the input biasing circuit 125 (FIG. 2). In the depicted embodiment, the biasing circuit 125 includes: a PMOS transistor 1552 having a gate 1554 connected to a node 1556, a source 1558 connected to $V_{DD}$, and a drain 1560 connected to node 1556 which provides the voltage level $V_{IB1}$ at the first terminal 128 (FIG. 1) of the input bias circuit 125; a PMOS transistor 1562 having a gate 1564 connected to ground, a source 1566 connected to node 1556, and a drain 1568 connected to ground; a PMOS transistor 1570 having a gate 1572 connected to a node 1574 which provides the voltage level $V_{IB2}$ at the second terminal 130 (FIG. 2) of the input biasing circuit 125, a source 1576 connected to $V_{DD}$, and a drain 1578 connected to node 1574; and a transistor 1580 having a gate 1582 connected to ground, a source 1584 connected to node 1574, and a drain 1586 connected to ground. Transistors 1552, 1562, 1570, and 1580 are sized properly for balanced input biasing of the limiting amplifier 102 (FIG. 2).

Table 4, below, shows transistor characteristics of each of the above recited transistors of FIG. 7.

TABLE 4

| Transistor Ref. No. | W (Channel Width) | L (Channel Length) | M (Multiple factor of Channel Width) |
|---|---|---|---|
| 1552 | 6 | 4 | 2 |
| 1562 | 6 | 4 | 2 |
| 1570 | 6 | 4 | 2 |
| 1580 | 6 | 4 | 2 |

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. An amplifier circuit responsive to a substantially DC balanced input data signal, and operative to generate an amplified data signal, the amplifier circuit comprising:
    a limiting amplifier responsive to the input data signal and to an error correcting signal, and being operative to generate the amplified data signal, said limiting amplifier including,
        a first amplifying stage having an input port for receiving the input data signal, and an output port for receiving the error correcting signal, said first amplifying stage being responsive to said input data signal and to said error correcting signal, and operative to generate a first stage amplified signal at said output port,
        a second amplifying stage responsive to said first stage amplified signal, and operative to provide a second stage amplified signal, and
        a third amplifying stage responsive to said second stage amplified signal, and operative to generate the amplified data signal, each of said first, second, and third amplified stages being implemented using complementary metal oxide semiconductor (CMOS) technology in accordance with source couple logic; and
    a feed back circuit responsive to said second stage amplified signal, said feed back circuit being operative to generate said error correcting signal, said feed back circuit including,
        a low pass filter responsive to said second stage amplified signal, and operative to generate a filtered signal, and
        an error amplifier responsive to said filtered signal, and operative to provide said error correcting signal to said limiting amplifier;
    whereby offset voltage caused by process characteristics of said limiting amplifier and temperature variations in said limiting amplifier are canceled by said feedback signal.

2. An amplifier circuit as recited in claim 1 wherein said feedback circuit further includes a feedback amplifier which is substantially similar to said third amplifying stage, said feedback amplifier being operative to further amplify said second stage amplified signal.

3. An amplifier circuit as recited in claim 1 wherein said low pass filter is a first order passive low pass filter.

4. An amplifier circuit as recited in claim 1 wherein said error amplifier comprises a folded cascode amplifying circuit.

5. A post-amplifier circuit for use in a fiber optic receiver, said post-amplifier circuit being responsive to a substantially DC balanced input data signal, and operative to generate an amplified data signal, the amplifier circuit comprising:
    a limiting amplifier responsive to the input data signal and to an error correcting signal, and being operative to generate the amplified data signal, said limiting amplifier including,
        a first amplifying stage having an input port for receiving the input data signal, and an output port for receiving the error correcting signal, said first amplifying stage being responsive to said input data signal and to said error correcting signal, and operative to generate a first stage amplified signal at said output port,
        a second amplifying stage responsive to said first stage amplified signal, and being operative to provide a second stage amplified signal, and
        a third amplifying stage responsive to said second stage amplified signal, and operative to generate the amplified data signal, each of said first, second, and third amplified stages being implemented using complementary metal oxide semiconductor (CMOS) technology in accordance with source couple logic; and
    a feed back circuit responsive to said second stage amplified signal, said feed back circuit being operative to generate said error correcting signal, said feed back circuit including,
        a low pass filter responsive to said second stage amplified signal, and operative to generate a filtered signal, and
        an error amplifier responsive to said filtered signal, and operative to provide said error correcting signal to said limiting amplifier;
    whereby offset voltage caused by process characteristics of said limiting amplifier and temperature variations in said limiting amplifier are canceled by said feedback signal.

6. A post-amplifier circuit as recited in claim 5 wherein said feedback circuit further includes a feedback amplifier which is substantially similar to said third amplifying stage, said feedback amplifier being operative to amplify said second stage amplified signal.

7. A post-amplifier circuit as recited in claim 5 wherein said low pass filter is a first order passive low pass filter.

8. A post-amplifier circuit as recited in claim 5 wherein said error amplifier comprises a folded cascode amplifying circuit.

* * * * *